under 35 U.S.C. 154(b) by 105 days.

(12) United States Patent
Abbott

(10) Patent No.: US 8,242,614 B2
(45) Date of Patent: Aug. 14, 2012

(54) THERMALLY IMPROVED SEMICONDUCTOR QFN/SON PACKAGE

(75) Inventor: Donald C Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 12/956,103

(22) Filed: Nov. 30, 2010

(65) Prior Publication Data

US 2011/0068443 A1    Mar. 24, 2011

Related U.S. Application Data

(62) Division of application No. 12/255,944, filed on Oct. 22, 2008, now Pat. No. 7,863,103.

(51) Int. Cl.
*H01L 23/28* (2006.01)

(52) U.S. Cl. ............... 257/787; 257/666; 257/E23.141; 257/E33.066; 257/E33.059; 257/E23.116; 257/E23.129

(58) Field of Classification Search ............... 257/666, 257/687, 787, E23.141, E33.066, E33.059, 257/E23.116, E23.129
See application file for complete search history.

(56) References Cited

U.S. PATENT DOCUMENTS

| | | | |
|---|---|---|---|
| 5,339,518 A | 8/1994 | Tran et al. | |
| 6,617,193 B1 | 9/2003 | Toshio et al. | |
| 2004/0036179 A1* | 2/2004 | Chiu et al. | 257/778 |
| 2004/0089925 A1* | 5/2004 | Fukuda et al. | 257/676 |
| 2007/0190694 A1 | 8/2007 | Punzalan et al. | |
| 2009/0166824 A1 | 7/2009 | Do et al. | |
| 2009/0166826 A1 | 7/2009 | Janducayan et al. | |

* cited by examiner

*Primary Examiner* — Michelle Mandala
(74) *Attorney, Agent, or Firm* — Steven A. Shaw; W. James Brady; Frederick J. Telecky, Jr.

(57) ABSTRACT

A semiconductor device without cantilevered leads uses conductive wires (120) to connect the chip terminals to the leads (110), and a package compound (140) to encapsulate the chip surface (101a) with the terminals, the wires, and the lead surfaces with the attached wires. The chip surface (101b) opposite the terminals together with portions (103) of the chip sidewalls protrude from the package, allowing an unimpeded thermal contact of the protruding chip surface to a substrate (201) to optimize the thermal flux from the chip to the substrate. Solder bodies (250) attached to the compound-free lead surfaces (113b) can be connected to the substrate so that the solder bodies are as elongated as the protruding chip height, facilitating the void-free distribution of an underfill compound into the space between chip and substrate, and improving the absorption of thermomechanical stresses during device operation.

9 Claims, 4 Drawing Sheets

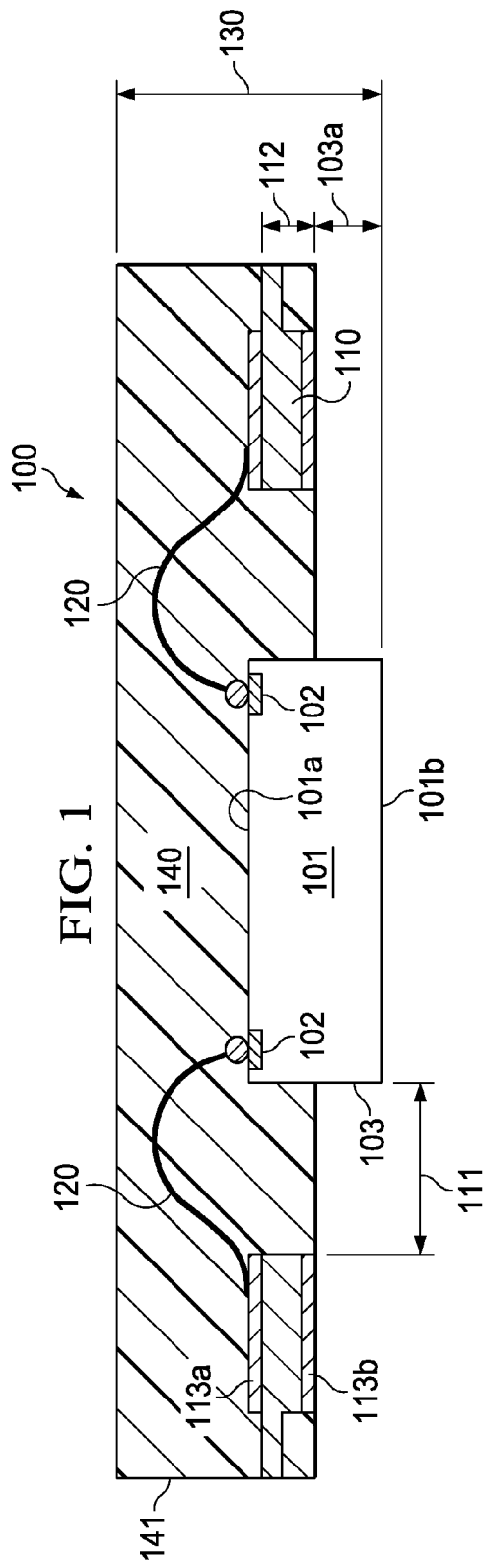
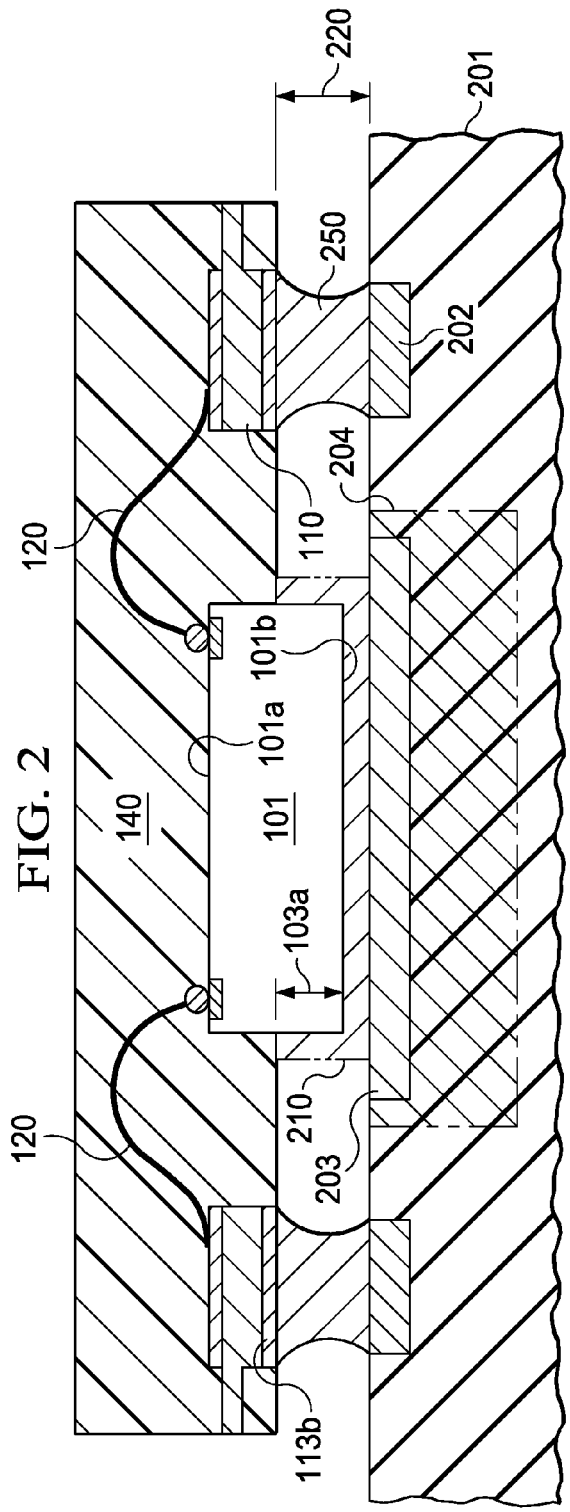

THERMALLY IMPROVED SEMICONDUCTOR QFN/SON PACKAGE

This is a division of application Ser. No. 12/255,944 filed Oct. 22, 2008, the contents of which are herein incorporated by reference in its entirety.

FIELD OF THE INVENTION

The present invention is related in general to the field of semiconductor devices and processes, and more specifically to the structure and fabrication method of thin Quad Flat-No-lead and Small Outline No-lead semiconductor packages with outstanding thermal characteristics.

DESCRIPTION OF RELATED ART

A major part of the conventional package of a semiconductor device is a metallic leadframe, commonly made of a copper alloy. The leadframe serves several needs. First, it includes a pad as a stable support for positioning the chip during the assembly steps; thereafter, during device operation, the pad is expected to support thermal conduction and heat distribution. The assembly itself is typically performed by attaching the chip to the pad with an adhesive polymer material, which is later polymerized. From the standpoint of distributing the operational heat from the chip to the outside world, the polymer layer represents a barrier, since its thermal conductivity is inferior compared to metal even when the polymer is loaded with a thermally conductive filler such as silver.

Second, the leadframe includes leads for providing electrical connections from the chip terminals to the periphery of the package and, for many devices, beyond the package to the master board. Actually, since the pitch between the chip terminals is much smaller than any practical pitch of the leads, the leads come to an end before reaching the chip; the remaining gaps between the lead tips and the chip terminals are bridged by spans of thin bonding wire. The most popular wire material is gold, alternatively a copper alloy.

In order to protect against mechanical and environmental influences, the chip, wires and major portions of the leadframe are encapsulated in a package, typically molded using a plastic compound. The outline of the compound is the perimeter of the package. In traditional semiconductor packages, the leads protrude from the package perimeter and can thus be formed in a variety of shapes suitable for attachment to external boards. The most common attachment method is soldering. In contrast, in Quad Flat No-lead (QFN) packages and in Small Outline No-lead (SON) packages, the leads do not protrude from the package outline and are thus attached, again commonly by soldering, to the external boards without lead forming or bending.

QFN/SON packages for devices, which create substantial operational heat, have the chip pad structured so that the metal protrudes from the plastic encapsulation so that the thermal energy can flow from the metal directly into external heat sinks. Even with this feature, the increased temperature requires these devices to use special contours or surface treatment of the leadframe metal to prevent delamination between the encapsulation compound and the leadframe under the influence of the increased temperature and external moisture.

In many families of QFN/SON devices, the connections to external parts is performed by solder paste attached to the lead ends at the package perimeter. Frequently, the external parts are boards made of materials with a coefficient of thermal expansion (CTE) drastically higher than the CTE of the chip. For example, with silicon (about 2.5 ppm/° C.) as the semiconductor material and plastic FR-4 (about 25 ppm/° C.) as board material, the difference in CTE is about an order of magnitude. When the assembly is subjected to temperature cycling during device usage or reliability testing, the CTE difference creates thermomechanical stresses on the solder connections. These stresses tend to fatigue the solder joints and the connections, resulting in microcracks and eventual failure of the assembly. The ongoing market trend to miniaturize the solder connections aggravates the failure mechanism.

SUMMARY OF THE INVENTION

Applicant recognizes that the ongoing market trend of miniaturization, especially in emerging applications of handheld and medical products, demand thermal and reliability characteristics for the semiconductor QFN/SON devices, which current design and manufacturing techniques cannot satisfy. For example, step function improvements are required in thermal performance, robustness in drop and moisture stability, internal adhesion, and also manufacturing cost reduction.

Applicant discovered a paradigm shift in the QFN/SON package construction, which solves these needs and bottlenecks. According to the invention, the package leadframe is free of the conventional pad, onto which the semiconductor chip is traditionally assembled with an adhesive polymer compound. Polymers are poor thermal conductors, and their interfaces are infamous for delaminations. Instead, the chip backside, free of the adhesive, protrudes from the molded package for direct, unimpeded heat dissipation to an external heat spreader or heat sink using metallic interconnection.

As an additional benefit, the device design with a protruding chip can create a thin package even while accepting the chip in its original thickness. As a consequence, the unwelcome wafer backgrinding step is no longer required and an ongoing source of process yield loss is thus eliminated. Further, the traditional risk of breaking wafers in the transportation from the wafer fabs to the assembly sites is diminished. In the process step of attaching the device with the protruding chip to a substrate or board, the chip protrusion provides the spacing needed for an elongation of the attached solder bodies; the elongated solder shape, in turn, improves the tolerance of thermo-mechanical stress between the substrate and the assembled chip during the temperature swings of the device-in-operation.

One embodiment of the invention is a semiconductor device without cantilevered leads, such as a QFN/SON device, which uses conductive wires to connect the chip terminals to the leads. A package compound encapsulates the chip surface with the terminals, the wires, and the lead surfaces with the attached wires. The encapsulation is configured so that the chip surface opposite the terminals together with portions of the chip sidewalls protrude from the package; further free of compound is a surface of each lead facing in the same direction as the protruding chip surface.

When the package is assembled on a substrate, the device structure of the invention allows an unimpeded thermal contact of the protruding chip surface to the substrate. In addition, solder paste attached to the compound-free lead surfaces can be connected to the substrate so that the paste forms a solder body as elongated as the protruding chip height. The elongated solder bodies offer improved absorption of thermomechanical stresses during device operation.

Another embodiment of the invention is a method for fabricating a QFN/SON-type device with optimized thermal characteristics. The process starts by providing a carrier plate with an opening to a recess; the opening has an outline suitable for inserting a semiconductor chip, and the recess has a depth equal to a first portion of the chip thickness. For high production volume, it is cost effective to shape the openings and the recesses into the material of the plate. For variable production loadings, it is more practical to have a flat plate and lay a spacer on it, which has a thickness equal to the first portion of the chip thickness, and variable openings.

A chip with terminals is inserted in the recess so that the terminals face away from the recess; a portion of the chip thickness is thus inside the recess, the surface opposite the terminals touches the recess, and the remaining thickness portion projects from the opening. A metal leadframe is laid on the plate so that the leads are positioned at a distance from the chip inserted in the opening. Then, the chip terminals are connected to the leads by spanning wires across the distance. Thereafter, the wires, the chip thickness projecting from the opening, and the leads are packaged in an encapsulation compound so that the lead surface facing the plate remains free of compound. When the package is lifted from the plate, the second chip surface and a portion of the chip sidewalls protrude from the package.

The technical advantage of improved QFN/SON thermal performance is based on the invention's structure to optimize the thermal flux. The thermal flux Q per unit of time is equal to the product of thermal conductivity $\lambda$ multiplied by the gradient of temperature T, in the direction of decreasing temperature, and by the area q perpendicular to the temperature gradient:

$$dQ/dt = -\lambda \cdot (\text{grad}\, T) \cdot q,$$

where Q is the vector (in magnitude and direction) of thermal flux, and $\lambda$ is the thermal conductivity, a materials characteristic. The thermal flux is in the direction of the temperature difference and is proportional to the magnitude of that difference. When, over the length l, the temperature drop is steady and uniform from the high temperature T2 to the low temperature T1, then (grad T) reduces to (T2−T1)/l:

$$dQ/dt = -\lambda \cdot (q/l) \cdot (T2 - T1).$$

$\lambda \cdot (q/l)$ is called the thermal conductance, and the inverse value $1/(\lambda \cdot q)$ is called thermal resistance.

The invention enhances the thermal flux vertically away from the heat-generating active circuit components into the substrate heat sink by improving $\lambda \cdot q$ (provided by the high thermal conductivity of silicon and copper and the geometry of conductors), and by improving (grad T) (provided by the relatively low temperature of heat sinks).

Other technical advantages of the invention include a reduction of manufacturing material costs by eliminating the adhesive chip-attach resin (together with the problems of controlling resin bleed and resin curing), and a reduction of manufacturing process costs by eliminating the step of back-grinding of the silicon wafer.

BRIEF DESCRIPTION OF THE DRAWINGS

FIG. 1 is shows a schematic cross section of a semiconductor QFN/SON-type device (a device without cantilevered leads) according to the invention.

FIG. 2 illustrates schematically the cross section of an apparatus according to an embodiment of the invention, in which a packaged semiconductor chip is assembled on a substrate for optimized heat dissipation.

FIG. 3 depicts a schematic cross section of a portion of a carrier plate with recesses suitable for inserting the partial height of semiconductor chips, the plate supporting the wire bond and encapsulation steps.

FIG. 4 shows a schematic cross section of the carrier plate with chips inserted in the recesses, further the leads of a leadframe positioned on the plate surface.

FIG. 5 shows a schematic cross section of the carrier plate with recesses, the inserted chips connected to the leads by bonding wires.

FIG. 6 illustrates a schematic cross section of a carrier portion to depict a modified method for inserting a chip into a recess of the carrier.

FIG. 7 is a schematic cross section of a portion of a flat carrier with a spacer on the surface, the spacer with an opening suitable for inserting a semiconductor chip.

FIG. 8 is a schematic cross section of a portion of a flat carrier with a spacer on the surface, the spacer with an opening etched in a specific manner to insert a semiconductor chip.

DETAILED DESCRIPTION OF THE PREFERRED EMBODIMENTS

Figure 3:
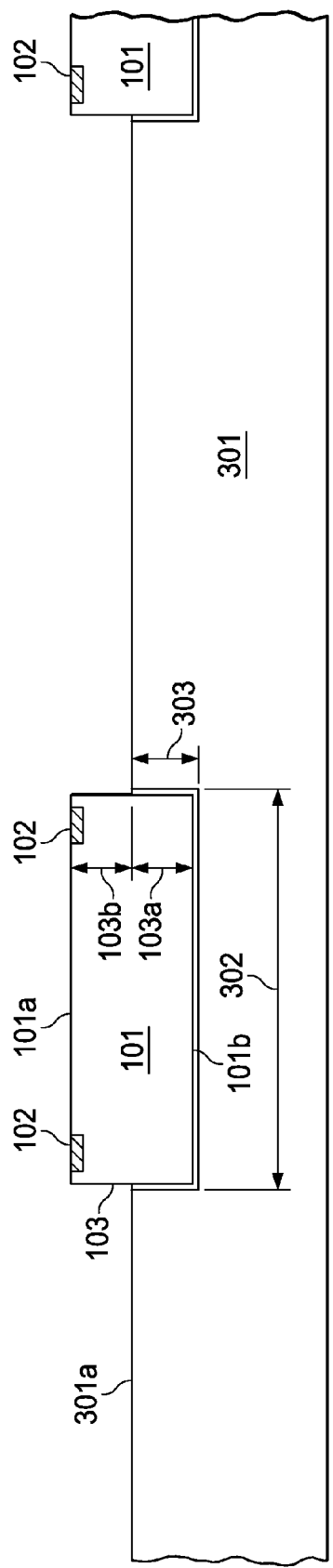
FIGS. 3 to 8 show steps for fabricating a QFN/SON-type semiconductor device with optimized thermal characteristics; a number of variations of the fabrication method are illustrated.

FIG. 1 (not to scale) illustrates an embodiment of the invention, generally designated 100. The Figure shows a packaged semiconductor device without cantilevered leads, which is frequently referred to as a Quad Flat No-lead (QFN) or Small-Outline No-lead (SON) device. The packaged device includes a semiconductor chip 101 with a first surface 101a and terminals 102, a second surface 101b opposite the first surface 101a, and sidewalls 103 between the surfaces. The sidewalls determine the thickness of chip 101; in the embodiment, the thickness is preferably in the range from about 225 to 350 µm.

The numerous process steps in the semiconductor integrated circuit manufacturing process flow require the robust wafer thickness of about 275 to 350 µm in order to avoid the risk of fracture during the frequent wafer handling. However, when customer applications call for a thin overall device thickness (0.55 to 1.0 mm), conventional technology requires a thin chip, necessitating a reduction of the wafer thickness from the original value down to sometimes about 100 µm by the process of back-grinding—a technique which even with latest refinements is still rough and is, therefore, an unwelcome process step. In contrast, the invention allows device thicknesses 130 to be between 0.55 and 1.0 mm without requiring a chip thinned by the cumbersome wafer backgrinding step. Instead, a chip thickness between 225 and 275 µm is acceptable.

As FIG. 1 depicts, device 100 includes metal leads 110, which are positioned at a distance 111 away from sidewalls 103. Leads 110 are portions of an original leadframe, which has been trimmed in the process of singulating (sawing after the molding step) device 100. Like the leadframe, leads 110 are made from a sheet of copper, aluminum, or alloys thereof in the thickness range from about 100 to 200 µm. Preferably, the overall thickness 112 of leads 110 include surface spots 113a and 113b of plated metal layers, which facilitate wire bonding and solder wetting. For the surface spots, a preferred sequence of layers includes a nickel layer (about 0.5 to 2.0 µm thick) in contact with the copper and a palladium layer (about 0.01 to 0.1 µm thick) in contact with the nickel. More preferably, an additional outermost gold layer (about 0.003 to 0.009

μm thick) is in contact with the palladium. The layers in spots 113*b* may be identical to the layers in spots 113*a*, or they may be different.

As FIG. 1 further shows, conductive wires 130 span from the chip terminals 102 to the surface spots 113*a* on leads 110. The bonding wires are preferably made of gold or a gold alloy; alternatively, they may be copper or a copper alloy. The arching of the wire span in FIG. 1 indicates that the wire connection has been produced by the ball bonding technique. An inherent feature of ball bonding (caused by the heat-affected zone in ball formation, see below) is the approximately vertical wire stretch before the curvature and bending of the arch; the stretch has a length of about 1 to 1.5 free air ball diameters, and the free air ball diameter is between about 1.2 and 4 wire diameters. As discussed below, the height of the arch may be reduced by modifying the ball bonding technique.

An encapsulation compound 140 packages the chip 101, wires 120, and leads 110 so that the second surface 101*b* of the chip and a portion of the chip sidewalls 103 protrude from the package. In FIG. 1, the height of the protruding sidewall portion is designated 103*a*. Further, leads 110 do not project from the package; this feature may be a consequence of the device singulation process (see below). In addition, the lead portions with the spots 113*b* are free of the encapsulation compound and thus expose the plated layers for solder attachment. As FIG. 1 shows, the compound-free spots 113*b* face in the same direction as the protruding second chip surface 101*b*. Solder paste may be attached to the spots 113*b* free of encapsulation compound.

In FIG. 2, the device 100 of FIG. 1 is assembled on a substrate 201, which includes conductive traces 202, heat spreaders 203, and heat sinks 204.

Because of its good thermal conductivity, the metallizations 202 and 203 are preferably made of copper. The second surface 101*b* of chip 101 is assembled on substrate 201 so that a thermally conductive contact is established between second surface 101*b* and substrate heat spreader 203 (or heat sink 204). Preferably, the thermally conductive contact is facilitated by a layer 210 of solder; alternatively, layer 210 may be a flat copper layer pre-deposited on chip 101, which is brought into intimate contact with the flat surface of copper layer 203. The assembly illustrated in FIG. 2 enables an optimum thermal flux away from the heat-generating circuit components on chip surface 101*a* through the high thermal conductivity of silicon chip 101 and metal layer 210 into the copper of heat spreader 203 or heat sink 204. In addition, the relatively cool temperature of heat sink 204 creates a steep temperature gradient from surface 101*a* to heat sink 204 and thus enhances the thermal flux from the active components to the heat sink.

As FIG. 2 shows, the assembly of the protruding chip surface 101*a* onto substrate metal 203 by means of attachment metal 210 creates the stand-off 220 of device 100 and substrate 201. This stand-off, in turn, makes it possible for solder paste to acquire an elongated shape for bodies 250, when the connections between leads 110 and traces 202 are formed. Elongated solder connections have been shown to be more tolerant to thermomechanical stresses, rendering the solder joints of the device attachment to the substrate more robust in device operation and reliability testing.

FIG. 2 indicates the additional opportunity to structure the thermally conductive contact 210 of the protruding chip so that the contact metal includes the sidewall portions 103*a*, leading to an additional improvement of the thermal conductivity from chip to substrate and thus of the thermal flux form the active components to the heat sink.

FIGS. 3 to 8 illustrate certain steps of the fabrication process flow, and certain equipment examples for performing these steps. The exemplary fabrication flow is described for batch processing, but applies also for individual processing. The process flow starts by providing a carrier plate for supporting semiconductor chips 101 during the bonding and encapsulation steps. An example of a plate is shown in FIG. 3 as a carrier, or plate, 301. The plate may be made of metal, ceramic, or an inert material able to tolerate elevated temperatures up to about 250° C.; further, the plate may be heatable. Plate 301 has a flat surface 301*a* and a plurality of openings 302 for recesses of a depth 303 from the surface 301*a*. Opening 302 has an outline suitable for enabling the insertion of a semiconductor chip 101, and the depth 303 of the recess is equal to a first portion 103*a* of chip sidewall (chip thickness) 103.

Figure 7:
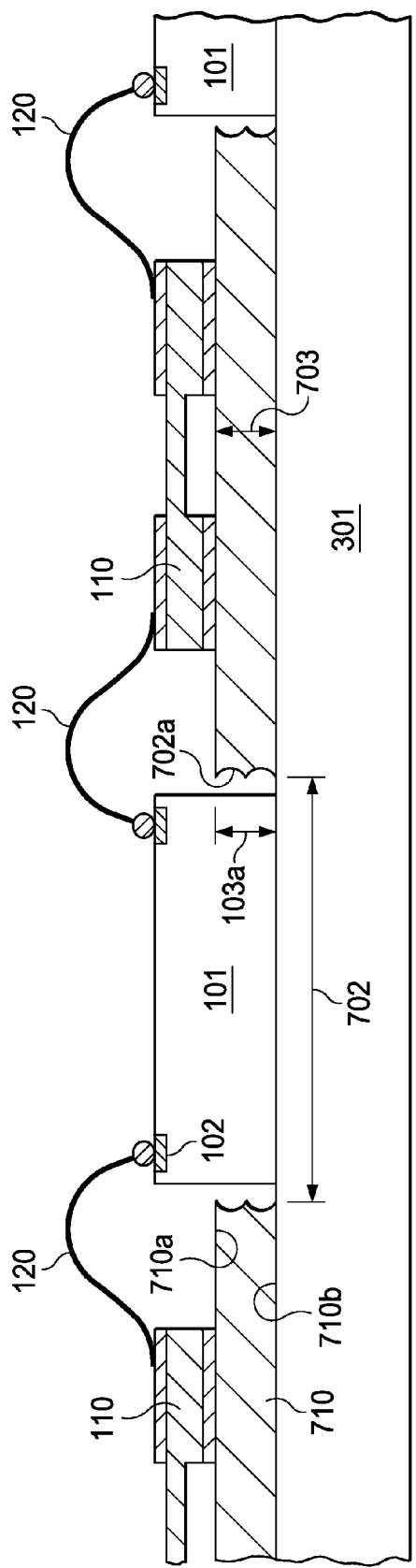
Figure 8:
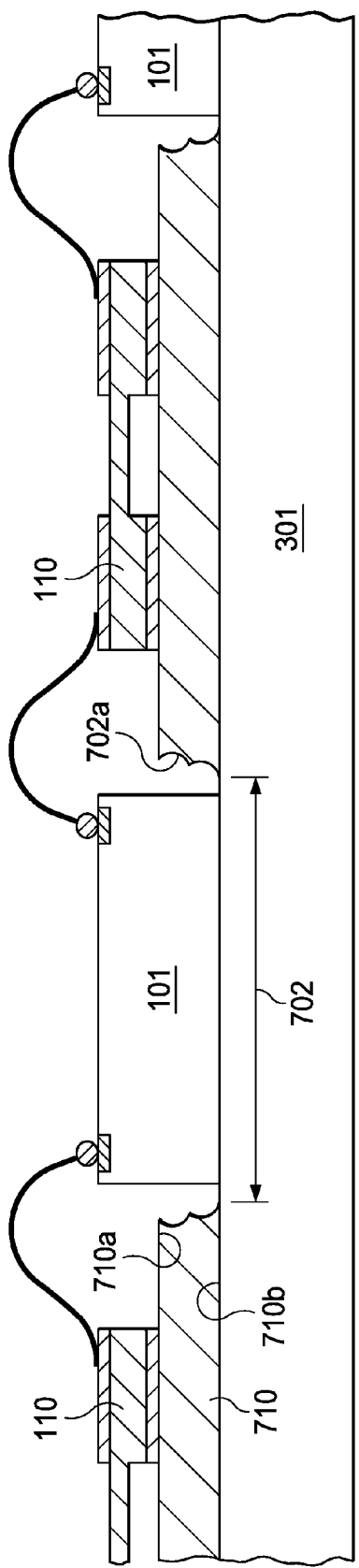

One method of creating the recesses is to shape them into the material of the plate, for instance by machining; this method has been used by the plate 301 in FIG. 3. This method lends itself to low-cost batch fabrication, when the chips size is not changed for a high number of runs, and a large number of units have to be built. Another method of creating the recesses is illustrated in FIG. 7. The surface of plate 701 is left flat; instead of machining the recesses, a spacer 710 is deposited onto the flat plate. Spacer 710 may be made of metal (for example stainless steel), ceramic, or an inert material, which tolerates elevated temperature up to about 250° C.; it may be reusable or disposable; and it is preferably inexpensive. Spacer 710 has a thickness 703 equal to the first portion 103*a* of the chip thickness (for instance 100 μm), and an opening 702 with an outline suitable for enabling the insertion of a semiconductor chip 101. Opening 702 may be formed by etching or stamping (for more detail about the etched profile of spacer 702 see the process description of FIG. 7). This method lend itself to low-cost fabrication, when the chip size has to be changed frequently, and only a modest number of units has to be built. When a spacer is employed, the plate may be a heat resistant inert tape (such as the so-called blue tape), which is held by a vacuum chuck.

The semiconductor chips 101 in FIGS. 3 to 8 have a first surface 101*a* with terminals 102 and an opposite second surface 101*b*. The thickness is given by sidewall 103; a first portion of the thickness is designated 103*a*, and the remaining second portion is designated 103*b*.

In the next process step, illustrated in FIG. 3, the chips 101 are inserted in the recesses of the plate so that first surface 101*a* faces away from the recess and the second surface 101*b* touches the recess. In this fashion, the first thickness portion 103*a* is inside the recess and the remaining second thickness portion 103*b* projects from the opening 302.

Figure 4:
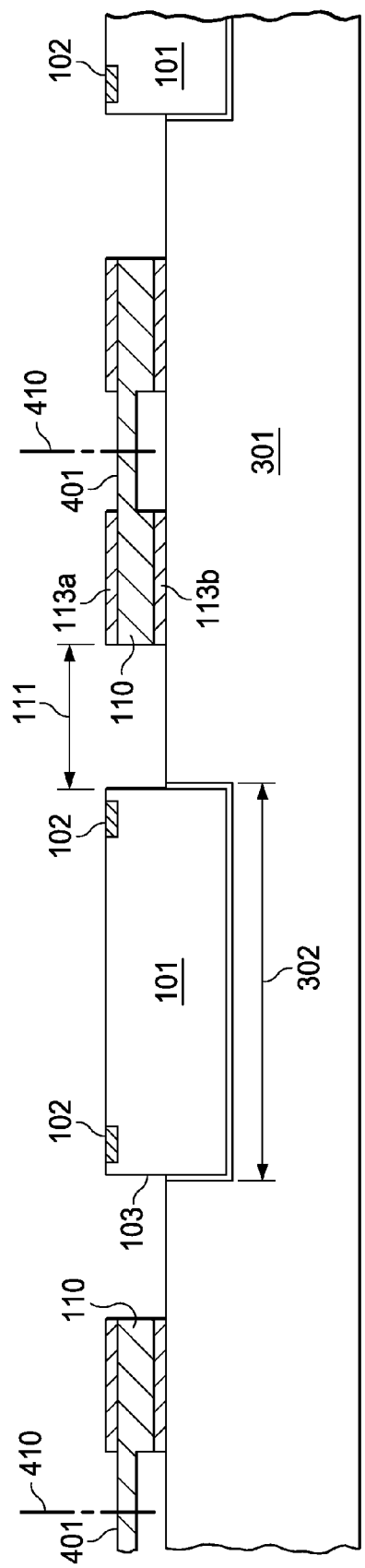

In the next process step, shown in FIG. 4, a substantially flat metal leadframe 401 is laid on plate 301. A preferred leadframe metal is a copper alloy; alternatively, the leadframe may be made of aluminum. The leadframe is substantially flat because it has been fabricated (by etching or stamping) from a sheet of metal (any steps to form specific leads or straps from the sheet are of secondary importance). The leadframe includes a plurality of leads, or segments, 110 which are near the openings 302 at a distance 111 from the inserted chip 101. Leads 110 lay flat on plate 301 and are held in place by the frame (not shown in FIG. 4). Leads 110 include a surface 113*a* with a metallurgical composition (for example, a gold layer) suitable for wire bonding, and a surface 113*b*, facing the plate 301, with a metallurgical composition suitable for solder attachment, for example a metal layer stack including a nickel layer in contact with the copper, a palladium layer in contact with the nickel, and an outermost gold layer in contact with the palladium).

Details of the leadframe shape are determined by the configuration of the leads and the need to lock the leads in the encapsulation process. When leads 401 are formed with thin portions, as shown by the example in FIG. 4, they facilitate easy singulation of the finished devices along lines 410, for instance by a sawing step after encapsulation.

Figure 5:
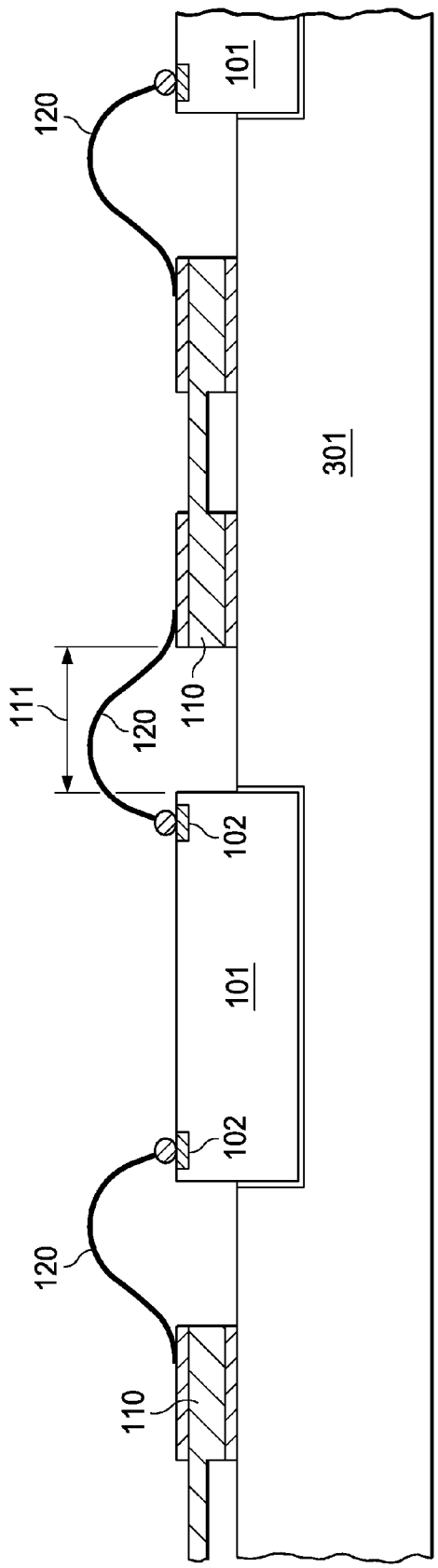

The next process step, depicted in FIG. 5, is performed after plate 301 is heated to the temperature required for wire bonding (preferably between 150 and 270° C.). By the step, the chip terminals 102 are connected to the leads 110 by spanning conductive wires 120 across the distance 111 between the inserted chip and the lead. Preferred wires include gold or a gold alloy, alternatively copper or copper alloy. The preferred bonding technique is ball bonding using a bonder with wires in the diameter range between 15 and 33 μm, preferably 20 to 25 μm. From the length of the gold wire protruding from the bonder capillary, a free air ball with a preferred diameter from about 1.2 to 1.6 wire diameters is formed. The free air ball is placed on the terminal 102 and pressed against the metallization of the pad. The capillary is lifted and the wire is moved towards the pad 110 forming an arch spanning the gap 111. The wire is attached to pad 110 by stitch bonding.

Figure 6:
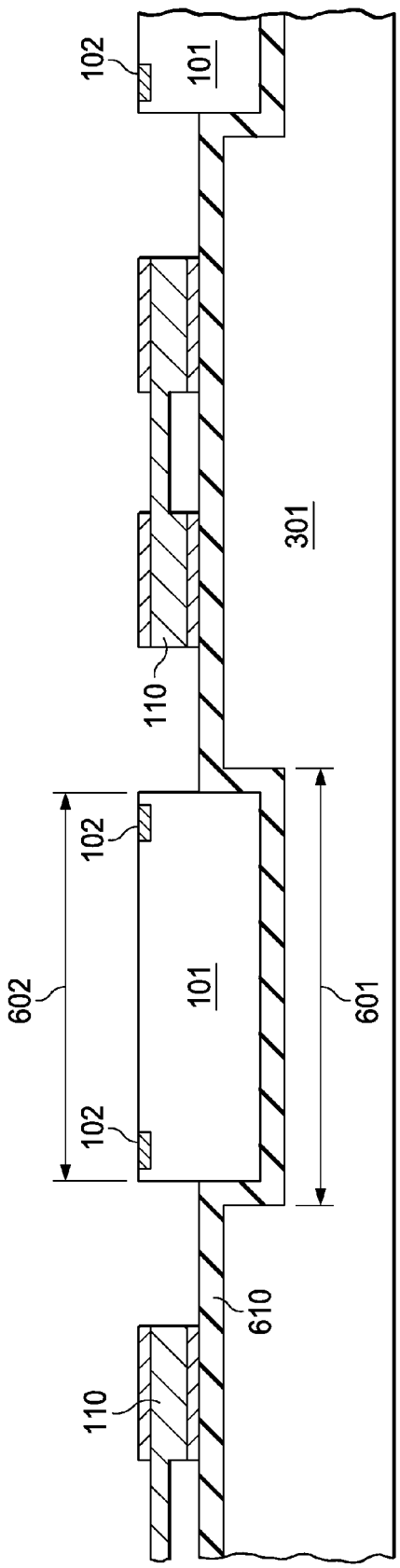

FIG. 6 indicates an equipment modification for cases, where the carrier plates have wider openings 601 than required for the size 602 of the chips-being-processed. Experience has shown that molded inert silicone sheets 610 can be used as inserts to fit into the oversize recesses and provide the narrower opening for the smaller chips. Sheets 610 are heat resistant and may be re-usable. They also may have contact adhesives to inhibit lateral movement of the chips and leadframes.

As mentioned above, when metallic spacers are used, the openings for inserting the semiconductor chips may be created by stamping or chemical etching. In FIG. 7, the flat spacer 710 is positioned on the flat surface of carrier plate 301; spacer 710 has a thickness 703 and an opening of width 702. Stamping produces openings with substantially smooth sidewalls normal to the spacer surfaces 710a and 710b. Chemical etching, on the other hand, may produce openings with contoured sidewalls. When the etchant can proceed from the surfaces 710a and 710b simultaneously, the sidewalls 702a of the opening may exhibit two concave contours as indicated in FIG. 7. When the etchant proceeds from the surface at different times or with different strength, the concave contours 702a may have tilted positions relative the surfaces 710a and 710b; see FIG. 8.

In the next process step, the chips, which are wire-connected to the leads, are encapsulated in order to create a solid package for chips and leads. A preferred encapsulation technique is transfer molding. For this method, carrier 301 with the plurality of chips, wire-connected the leads as illustrated in FIG. 5, is placed in the cavity of a mold. The molding compound, preferably an epoxy-based polymer material with silica filler particles, is pressed into the cavity to cover the chips, the leads, and the wires; the chip arrangement on the carrier insures that the compound does not cover the surfaces of the chips and leads facing the carrier. After hardening (polymerizing) the compound, the plurality of encapsulated chips and leads forms an array of packaged devices; the whole array can be removed from the carrier.

Using a saw and cutting along the lines 410 indicated in FIG. 4, the array is singulated into discrete packaged devices as illustrated in FIG. 1. The saw lines are designated 141. As shown in FIG. 1, each packaged device has a surface of the chip and a portion of the chip sidewalls protrude from the encapsulation compound, a portion of the leads is free of compound, and the leads do not project from the package.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the semiconductor chip may have on its surface protruding from the package a metallization (for example, a layer of copper and/or gold) to facilitate the contact to a external heat sink. Or it may have a metallization with affinity to solder, for instance a nickel layer followed by a palladium layer. In another example, the protruding chip may fit directly into a preformed heat spreader.

It is therefore intended that the appended claims encompass any such modifications or embodiments.

I claim:

1. An apparatus comprising:
    a semiconductor chip having a first surface with a terminal, a second surface opposite the first surface, and a sidewall between the surfaces;
    a metal lead at a distance from the sidewall;
    a conductive wire spanning from the terminal to the lead; and
    encapsulation compound packaging the chip, the wire and the lead so that the second surface and a portion of the sidewall protrude from the package, the lead does not project from the package, and a portion of the lead is free of compound.

2. The apparatus of claim 1 in which the second chip surface and the compound-free lead portion face in the same direction.

3. The apparatus of claim 2 further including a metallurgical surface composition of the compound-free lead portion suitable for solder attachment.

4. The apparatus of claim 3 further including a solder body adhering to the compound-free lead portion.

5. The apparatus of claim 4 further including a substrate onto which the package is assembled.

6. The apparatus of claim 5 further including a thermally conductive contact of the second chip surface to the substrate.

7. The apparatus of claim 6 further including a thermally conductive contact of the protruding chip sidewall to the substrate.

8. The apparatus of claim 6 further including a connection of the solder body to the substrate.

9. The apparatus of claim 8 further including an elongated outline of the solder connection.

* * * * *